Feb. 27, 1962 H. NELSON ET AL 3,022,568

SEMICONDUCTOR DEVICES

Filed March 27, 1957

INVENTORS
HERBERT NELSON
& JOHN BERNATH

BY J. L. Whittaker

ATTORNEY

United States Patent Office 3,022,568
Patented Feb. 27, 1962

3,022,568

SEMICONDUCTOR DEVICES

Herbert Nelson and John Bernath, Princeton, N.J., assignors to Radio Corporation of America, a corporation of Delaware Filed Mar. 27, 1957, Ser. No. 648,855
10 Claims. (Cl. 29—25.3)

This invention relates to improved semiconductor devices, more particularly, to improved broad-area junction devices such as transistors.

It is known to make broad-area junctions by immersing a semiconductive wafer of one conductivity type in an ambient or vapor of a material that diffuses into the wafer and induces conductivity of the opposite type. A surface layer is thus formed having conductivity type opposite to that of the bulk of the wafer. The interface or junction between the surface layer and the bulk of the wafer constitutes a rectifying barrier. The wafer requires subsequent processing to form the desired device. In such processing it has been found difficult to control the size and particularly the exact shape of the diffusion-doped regions of the units by conventional methods, such as masking and etching the wafers in acids. Another serious problem that arises from the small sizes of the wafer and the shallow depth of the opposite conductivity type surface layer is the difficulty of making good electrical connections to the different zones of each unit. Techniques for this purpose which are satisfactory in the laboratory are often not suitable for mass production.

It is therefore an object of this invention to provide improved semiconductor devices.

Another object of this invention is to provide improved broad-area junction transistors.

A further object of this invention is to provide improved methods of controlling the size and exact shape of the diffusion-doped regions of broad-area junction devices.

Still another object of this invention is to provide improved broad-area junction devices having a structure which facilitates the making of electrical connections to the several regions thereof.

These and other objects of the invention are accomplished by the utilization of a precision multiple lapping technique instead of etching to fabricate improved semiconductor devices having broad-area junctions of controlled size and shape. For example, recessed areas of controlled size and shape are formed on a major surface of a given conductivity type wafer by lapping regular grooves across one major wafer face. A surface layer of the wafer is converted to opposite conductivity type by diffusing an appropriate impurity into the wafer. The wafer is lapped again so as to remove the opposite type surface layer from the grooved face, excepting the recessed areas. A coating of conductive metal is deposited over the entire wafer, and it is then lapped again so as to widen the upper portion of the grooves. Thereafter the wafer is diced into units which are fabricated into devices such as transistors by conventional techniques for mounting, attaching electrical leads, and encapsulating.

The invention will be described in greater detail with reference to the accompanying drawing, in which.

Similar reference numerals are applied to similar elements throughout the drawing.

Figures 1, 2, 3, 4, 5, 6, 7, 8, 9, 10, 11, 12, 13, 14, 15, 16, 17, 18:
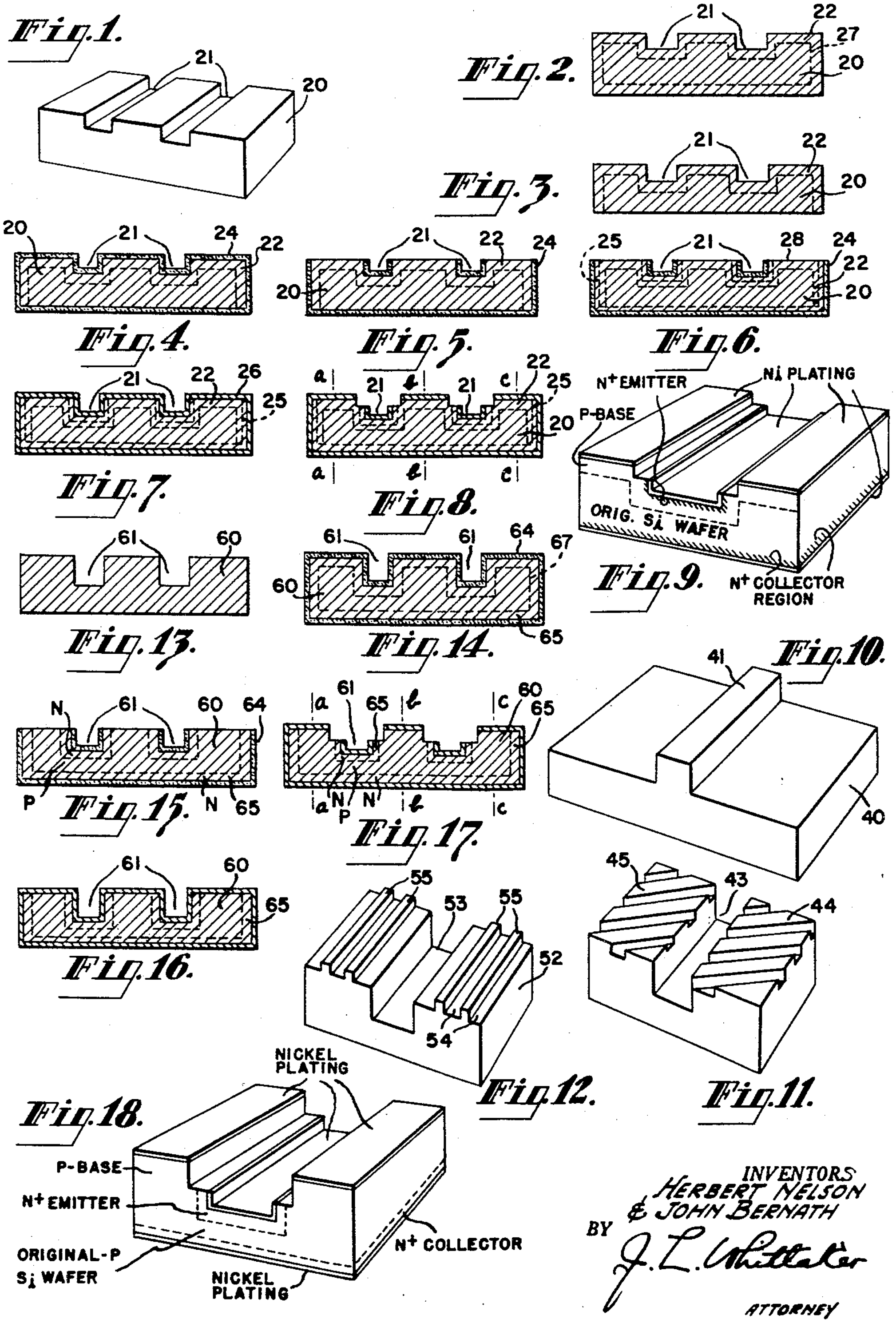
FIGURE 1 is a schematic isometric view of the first step in making a junction device according to one embodiment of the invention, in which the collector region is the original wafer.
FIGURES 2–8 are schematic cross-sectional views illustrating successive steps in the fabrication of the device.
FIGURE 9 is a schematic isometric view of the unit after the operations shown in FIGURES 1–8.
FIGURE 10 is a schematic isometric view of the lapping jig used in the method of this invention.
FIGURES 11 and 12 are isometric views of the lapheads used in the method of this invention.
FIGURES 13–17 are schematic cross-sectional views illustrating the fabrication of a transistor according to another embodiment of the invention, in which the original wafer is used as the base region.
FIGURES 18 is a schematic isometric view of the structure made by the operations shown in FIGURES 13–17.

Referring to FIGURE 1 of the drawing, a wafer 20 of monocrystalline semiconductive material of given conductivity type is prepared. In a typical example the wafer is N-conductivity type silicon of about 0.5–10 ohm centimeters resistivity. The exact size of the wafer is not material. For example, the wafer may be one inch long by one half inch wide by eight mils thick. Regular grooves 21 are lapped into one major face of the wafer 20, so as to produce recessed areas across the wafer. In this example, the grooves 21 are about 80 mils wide, 2 mils deep, spaced about 90 mils apart, and have a rectangular cross section.

Referring to FIGURE 2 of the drawing, the wafer 20 is immersed in an atmosphere that will induce opposite type conductivity in the wafer. In this example, since the wafer is of N-conductivity type, the atmosphere selected is one which will induce P-conductivity type. A suitable P-type inducing material for silicon is boron. The wafer 20 is treated for about 3 minutes at about 1200° C. in a flowing ambient consisting of about 1 volume boron trichloride and 300 volumes nitrogen. Some boron trichloride decomposes and deposits boron on the wafer surface. The ambient is then changed to pure nitrogen, and the wafer is heated for about 4 hours at about 1300° C. The boron on the wafer surface diffuses into the wafer 20 during the heating, and forms a thin layer 22 of P-conductivity type over the entire wafer. Under these conditions, the P-type layer 22 is about 1.8 mils thick. A P-N junction 27 is formed at the interface of the P-type layer 22 and the N-type bulk of the wafer.

Referring to FIGURE 3 of the drawing, the major wafer surface opposite the grooved surface is then lapped so that the P-type layer 22 is removed. The N-type bulk of the wafer is thus exposed at this surface.

Referring to FIGURE 4, the wafer 20 is covered with a film 24 of material that induces the same conductivity type as the bulk of the crystal. In this example, a suitable material for inducing N-type conductivity in silicon is phosphorus. The wafer 20 is heated for 20 minutes at 1200° C. in a stream of nitrogen which has been passed over phosphorus pentoxide kept at 120° to 160° C. An amorphous, glassy, phosphorus-containing film 24 is thereby formed over the entire wafer surface.

Referring to FIGURE 5, the unit is lapped again so as to remove the phosphorus-containing film 24 from the lands only. The lapping is continued so as to remove about 0.2 mil of the silicon surface of the lands.

Referring to FIGURE 6, the unit is heated at 1300° C. in pure nitrogen for about two hours to diffuse the phosphorus from the remaining portion of the film 24 into the wafer. During this period the boron already present will penetrate deeper into the wafer, so that the P-type layer 22 becomes thicker. Some boron trichloride may be introduced at the beginning of this step, at a temperature of about 1200° C., for about 3 minutes, to assure P-type conductivity for the lands. The boron will only diffuse into the lands as the rest of the wafer is covered by the phosphorus-containing film 24. The phosphorus diffusion front travels faster than the boron, but does not catch up with it, so that a separation of about 0.5 mil remains between the two fronts. The diffusion of the phosphorus causes the formation of an N-conductivity type zone 25 just below the surface of the wafer. Under these conditions, the N-type zone 25 is about 1.2 mils thick. A P-N junction 28 is formed at the interface of the N-type zone 28 and the P-type layer 22.

Referring to FIGURE 7, the phosphorus-containing surface film 24 is removed and the entire wafer surface cleaned before covering the wafer with a plating 26 of a metal that makes a good ohmic contact but does not affect the conductivity type of the silicon. The metal plating 26 facilitates the fabrication of good electrical connections to the different regions of the completed device. A suitable metal for this purpose is nickel. A bright adherent nickel plating may be deposited over the surface of the silicon by the electroless nickel plating technique described by A. Brenner in "Metal Finishing 52," No. 11, 68 (1954).

Referring to FIGURE 8, the unit is again lapped so as to widen the upper portion of each groove by 6 mils to a depth of about .7 mil. As the P-type zone 22 is about 1.8 mils thick, this lapping does not interfere with the continuity of the zone 22. The N-conductivity zone 25 and the heavily doped portion of the silicon is removed from the upper portion of each groove by this step. The removal of this material prevents shorting of the device by insuring a high reverse resistance between the emitter and base. The wafer is then diced into units by cutting along the line *a—a*, *b—b*, *c—c*, and along planes perpendicular to the length of the groove.

The unit thus formed is shown in FIGURE 9. Leads (not shown) are subsequently attached to the nickel plating on one land, on the groove bottom, and on the opposite surface. The N-type region on the groove bottom serves as the emitter. The P-type region under the groove bottom and under the lands serves as the base. The N-type bulk of the wafer serves as the collector. Transistors thus made exhibit a power gain as high as 40 decibels. This embodiment of the invention produces units with very thin and uniform base width, and is hence suitable for high frequency transistors.

Although the method has been described in terms of an N-conductivity type silicon wafer, it will be understood that the invention is equally applicable to other semiconductive materials, such as germanium, cadmium telluride, gallium arsenide, and indium phosphide. For example, the invention may be applied to a selenium doped N-conductivity type indium phosphide wafer. Regular grooves are lapped into one major surface, and the wafer is then heated in a cadmium atmosphere to form a thin P-conductivity type zone over the surface. A coating of tellurium is used to convert the grooved bottoms to N-conductivity type. Instead of nickel, a plating of indium is used to make ohmic contacts to the various regions of the device. It will be understood that the invention may be utilized beginning with P-conductivity type wafers by means of N-type-inducing ambient atmospheres.

Since the wafer is first lapped to form grooves, and is subsequently lapped again to widen the upper portion only of the grooves, a precise jig is necessary to insure that only the desired portions of the wafer are removed during each lapping operation. A suitable jig is shown in FIGURE 10. The jig consists of an accurate lap table 40 with a guide rail 41 running along the center line of the table surface. The top surface of the guide rail 41 must be parallel to the top of the table 40. The height of the guide rail 41, in conjunction with the precise geometry of the different lapping heads, determines the depth of the grooves.

In operation, the silicon wafers are preferably embedded in a material such as paraffin wax and placed against the guide rail 41. The first type of lap-head 42 used is shown in FIGURE 11. It consists of a block of metal having a key way 43 that will just slide over the guide rail 41. The working surface 44 of the lap-head bears cutting grooves 45 at an angle of 30 degrees to the key way 43. Running the lap-head 42 back and forth over the guide rail 41 removes the desired amount of material from the upper surface of the wafer.

The second type of lap-head used is shown in FIGURE 12. This lap-head 52 also has a key way 53 that will just slide over the guide rail 41. The adjacent working surface 54 of the lap-head bears cutting bars 55 which are parallel to the key way 53, and cut the desired grooves into the wafers. The spacing and height of the bars determines the spacing and depth of the grooves. In order to widen the upper portion only of the grooves, a similar lap-head is used in which the bars are wider but not as high. In these two lap-heads the cutting bars must be identically spaced from the key way, so that the centers of the initial grooves and the secondary grooves coincide.

In the first embodiment of the invention, the emitter and the base are diffusion doped regions, while the collector is the original wafer. Another embodiment of the invention may be utilized in which the emitter and the collector are diffusion doped regions, while the base is the original wafer. Referring to FIGURE 13, a semiconductor wafer 60 is prepared about 10 mils thick. The semiconductor may be silicon or germanium or one of the III-V compounds. In this example, the wafer is P-conductivity type silicon. Regular grooves 61 are lapped into one major surface of the wafer 60. The grooves 61 may be about 80 mils wide, 6 mils deep, spaced about 100 mils apart, and have a rectangular cross section.

Referring to FIGURE 14, the entire surface of the wafer 60 is covered with a phosphorus-containing film 64 by heating it for 20 minutes at 1200° C. in a stream of nitrogen which has been passed over phosphorus pentoxide kept at 120° to 160° C. The wafer 60 is then heated for about 3 hours at about 1300° C. in pure nitrogen, so that some of the phosphorus diffuses from the film 64 into the wafer and forms an N-conductivity zone 65 just below the surface of the wafer. The zone 65 thus produced is about 1.25 mils thick. A P-N junction 67 is formed at the interface of the N-type zone 65 and the P-type bulk of the wafer.

Referring to FIGURE 15, the wafer 60 is lapped again so as to remove 2 mils of the material from the top of the lands. Since the N-type zone 65 is less than 2 mils thick, the original P-type bulk of the wafer is exposed at the lands. The wafer is then heated again for about 3 minutes at about 1200° C. in an atmosphere containing boron trichloride. This step deposits some boron on the lands, and is used to make certain that the lands are P-type. The rest of the wafer is not affected, since it is covered by the glassy phosphorus-containing film 64. The wafer is next heated for about one hour at about 1300° C. in pure nitrogen. During this period the N-type region 65 becomes thicker, hence the P-type region between the grooves and the wafer bottom becomes thinner.

Referring to FIGURE 16, the phosphorus-containing film 64 is removed and the entire wafer surface cleaned before covering the wafer with an electroless nickel plating 66.

Referring to FIGURE 17, the water 60 is lapped again to widen the upper 3 mils of the grooves 61. The nickel plating 66 and the N-conductivity zone 65 and the heavily doped portion of the silicon is thereby removed from the upper portion of each groove side. The removal of this material insures a high reverse resistance between emitter and base regions. The wafer is then diced into units by cutting along the lines *a—a*, *b—b*, *c—c*, and along planes parallel to the length of the wafer.

Leads (not shown) are subsequently attached to the nickel plating on one land, on the groove bottom, and on the opposite surface. In this embodiment the base region is the original wafer, hence the resistivity of the base may be more easily controlled. Another advantage of this embodiment is the high conductivity of the collector.

It will be understood that the heating cycles are mentioned by way of illustration, and not as limitations. Equivalent results may be obtained by heating at higher temperatures for shorter periods, or at lower temperatures for longer periods. Other doping materials may be used with appropriate changes in the processing procedure. The dimensions given are also by way of example only, and not as limitations, since wafers of any convenient size may be used. The thickness of the diffused zones in the wafers will depend on the materials used and the temperature and duration of heating.

Other modifications may be made within the scope and spirit of the invention. For example, the recessed area prepared in one major wafer face may be circular flat-bottomed pits. Such recessed areas may be made with a supersonic drilling tool, or with a conventional diamond drill. A larger drilling tool may be used to widen the upper portion of the recessed area. Other semiconductors may be utilized in place of silicon. For example, the starting material may be a wafer of indium-doped P-conductivity type monocrystalline germanium. Grooves are lapped into one major wafer face. A surface layer of the wafer is then converted to N-conductivity type by heating it in an enclosed space, such as a well in a jig, together with a germanium source wafer containing sufficient N-type-inducing impurity to have a resistivity of about .001 ohm centimeters. Suitable impurity materials for this purpose are arsenic, antimony, and phosphorus. In this example, the source wafer contains arsenic. The jig is heated in a hydrogen furnace for about 15 minutes at about 800° C. Vapors of arsenic are given off by the source wafer, and fill the entire well. The vapors diffuse into the surface of the grooved germanium wafer so that an N-conductivity type surface layer is formed. The thickness of the N-type layer is determined by the amount of impurity present, and the time and duration of heating. By accurately controlling the thickness of the diffused N-type zone, the step of heating the wafer in a P-type ambient such as boron trichloride to insure P-type lands may be omitted. An adherent conductive metal coating is deposited on the wafer by the same electroless nickel plating technique used with silicon. The remaining steps of lapping the wafer to widen the upper portion of the grooves, dicing the wafer into units, mounting the units, attaching electrical leads, and encapsulating the units, are performed in the same manner as described above with reference to silicon.

There have thus been described new and useful forms of semiconductor devices as well as methods for making these devices.

What is claimed is:

1. A method of making semiconductor devices comprising the steps of lapping regular shallow grooves into a major face of a monocrystalline semiconductive wafer of a given conductivity type, converting the entire surface layer of said grooved face to the opposite conductivity type, covering the bottom of said grooves with a conductivity type-determining material of said given type, heating said wafer so as to diffuse said material into said wafer, lapping said grooved face so as to widen the upper portion of said grooves, dicing said wafers into units containing one groove between two lands, and thereafter attaching suitable electrical leads to said units.

2. A method of making semiconductor devices comprising the steps of lapping regular shallow grooves into a major face of a monocrystalline semiconductive wafer of given conductivity type, converting the entire surface layer of said wafer to the opposite conductivity type, lapping said grooved faces so as to widen the upper portion of said grooves, dicing said wafers into units containing one groove between two lands, and thereafter attaching suitable electrical leads to said units.

3. A method of making semiconductor devices comprising the steps of preparing a monocrystalline semiconductive wafer of given conductivity type, lapping regular shallow grooves into one major surface, diffusing into the entire surface of said wafer an opposite type-determining impurity so as to produce a zone of said opposite conductivity type, removing said zone from the surface opposite said grooved surface, covering the wafer with a conductivity type-determining material of said given conductivity type, lapping said grooved surface so as to remove said material except for the portion at the bottom of the grooves, heating said wafer in an inert atmosphere so as to diffuse said material into said groove bottoms, lapping said wafer so as to widen the upper portion of said grooves, dicing said wafer into units containing one groove between two lands, and thereafter attaching suitable electrical leads to said units.

4. A method of making semiconductor devices comprising the steps of preparing a monocrystalline semiconductive wafer of given conductivity type, lapping regular shallow grooves into one major surface, diffusing into the entire surface of said wafer a conductivity type-determining impurity so as to form a zone of the opposite conductivity type, removing said zone from the surface opposite said grooved surface, covering the wafer with a conductivity type-determining material of said given conductivity type, lapping said grooved surface so as to remove said material except for the portion at the bottom of the grooves, heating said wafer in an inert atmosphere so as to diffuse said material into said groove bottoms, removing the remainder of said material, depositing a metal plating on said wafer, lapping said wafer so as to widen the upper portion of said grooves, dicing said wafer into units having one groove between two lands, and thereafter attaching electrical leads to said units by means of said metal plating.

5. A method of making semiconductor devices comprising the steps of lapping regular shallow grooves into a major face of a monocrystalline semiconductive wafer of given conductivity type, converting the entire surface layer of said wafer to the opposite conductivity type, depositing a metal plating on said wafer, lapping said wafer so as to widen the upper portion of said grooves, dicing said wafer into units having one groove between two lands, and thereafter attaching electrical leads to said units by means of said metal plating.

6. A method of making semiconductor devices comprising the steps of preparing a monocrystalline semiconductive silicon wafer doped with phosphorus so as to be of N-conductivity type, lapping regular shallow grooves into one major surface of said wafer, diffusing boron into the entire surface of said wafer so as to form a thin P-conductivity zone, removing said P-type zone from the surface opposite said grooved surface, covering the wafer with a coating of phosphorus-containing material, lapping said grooved surface so as to remove said coating except for the portion at the bottom of said grooves, heating said wafer in an inert atmosphere so as to diffuse the phosphorus into the wafer, removing the remainder of said phosphorus-containing material, depositing a nickel plating over said wafer, lapping said wafer so as to widen the upper portion of said grooves, dicing said wafers into units having one groove between two lands, and thereafter attaching electrical leads to said units by means of said nickel plating.

7. A method of making semiconductive devices comprising the steps of preparing a monocrystalline boron-doped P-conductivity type silicon wafer, lapping regular shallow grooves into one major surface of said wafer, covering the wafer with a film of phosphorus-containing material, heating said wafer in an inert atmosphere so as to diffuse the phosphorus into the wafer and form an N-conductivity type surface layer, lapping said grooved surface so as to remove said surface layer from the areas between the grooves, heating said wafer in a boron-containing ambient, lapping said wafer so as to remove said phosphorus-containing film, depositing a nickel plating over said wafer, lapping said wafer so as to widen the upper portion of said grooves, dicing said wafer into units having one groove between two lands, and attaching electrical leads to said nickel plating on said lands, said groove bottom, and the face opposite said grooved face.

8. A method of making semiconductive devices comprising the steps of preparing a monocrystalline indium-doped P-conductivity type germanium wafer, lapping regular shallow grooves into one major surface of said wafer, heating said wafer in an arsenic-containing atmosphere so as to diffuse the arsenic into the wafer and form an N-conductivity type surface layer, lapping said grooved surface so as to remove said surface layer from the areas between the grooves, depositing a nickel plating over said wafer, lapping said wafer so as to widen the upper portion of said grooves, dicing said wafer into units having one groove between two lands, and attaching electrical leads to said nickel plating on said lands, said groove bottom, and the face opposite said grooved face.

9. A method of making semiconductor devices comprising the steps of preparing a monocrystalline selenium doped N-conductivity type indium phosphide wafer, lapping regular shallow grooves into one major surface of said wafer, diffusing cadmium into the entire surface of said wafer so as to form a thin P-conductivity type zone, removing said P-type zone from the surface opposite said grooved surface, covering the wafer with a coating of tellurium, lapping said grooved surface so as to remove said tellurium coating except for the portion at the bottom of said grooves, heating said wafer in an inert atmosphere so as to diffuse tellurium into said groove bottoms, removing the remainder of the tellurium, depositing an indium plating on said wafer, lapping said wafer so as to widen the upper portion of said grooves, dicing said wafers into units having one groove between two lands, and thereafter attaching electrical leads to said indium plating.

10. A method of making semiconductor devices comprising the steps of forming regular shallow grooves in a major face of a monocrystalline semiconductive wafer of a given conductivity type, converting the entire surface layer of said grooved face to the opposite conductivity type, covering the bottom of said grooves with a conductivity type-determining material of said given type, heating said wafer so as to diffuse said material into said wafer, widening the upper portion of said grooves, dicing said wafers into units containing one groove between two lands, and thereafter attaching suitable electrical leads to said units.

References Cited in the file of this patent

UNITED STATES PATENTS

| | | |
|---|---|---|
| 2,705,767 | Hall | Apr. 5, 1955 |
| 2,714,183 | Hall et al. | July 26, 1955 |
| 2,731,704 | Spanos | Jan. 24, 1956 |
| 2,744,308 | Loman | May 8, 1956 |
| 2,814,853 | Paskell | Dec. 3, 1957 |